US012669889B2

(12) United States Patent
Kang et al.

(10) Patent No.: US 12,669,889 B2
(45) Date of Patent: Jun. 30, 2026

(54) ELECTRONIC DEVICE

(71) Applicant: SAMSUNG DISPLAY CO., LTD., Yongin-si (KR)

(72) Inventors: Bongil Kang, Yongin-si (KR); Min-Hong Kim, Yongin-si (KR); Sangkook Kim, Yongin-si (KR); Jiyeong Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 17 days.

(21) Appl. No.: 18/800,393

(22) Filed: Aug. 12, 2024

(65) Prior Publication Data

US 2025/0199637 A1       Jun. 19, 2025

(30) Foreign Application Priority Data

Dec. 15, 2023     (KR) ......................... 10-2023-0182876

(51) Int. Cl.
| | |
|---|---|
| *G06F 3/041* | (2006.01) |
| *G06F 3/044* | (2006.01) |
| *H04M 1/02* | (2006.01) |
| *H10K 59/40* | (2023.01) |

(52) U.S. Cl.
CPC ........ *G06F 3/04164* (2019.05); *G06F 3/0446* (2019.05); *H04M 1/0277* (2013.01); *H10K 59/40* (2023.02); *H04M 2250/22* (2013.01)

(58) Field of Classification Search
None
See application file for complete search history.

(56) References Cited

U.S. PATENT DOCUMENTS

| | | | |
|---|---|---|---|
| 10,003,044 B2 | 6/2018 | Nam et al. | |
| 11,330,704 B2 * | 5/2022 | Toyama ............... | H05K 9/0039 |
| 2011/0169791 A1 * | 7/2011 | Hida ..................... | G02F 1/1345 |
| | | | 345/204 |
| 2017/0188469 A1 * | 6/2017 | Taguchi ................. | H05K 3/284 |
| 2019/0302953 A1 * | 10/2019 | Lee .......................... | G06F 3/044 |

FOREIGN PATENT DOCUMENTS

KR          10-2206376 B1     1/2021

* cited by examiner

*Primary Examiner* — Krishna P Neupane
(74) *Attorney, Agent, or Firm* — F. CHAU & ASSOCIATES, LLC

(57) ABSTRACT

An electronic device including: a display layer; a cover layer disposed under the display layer; a circuit board connected to the display layer and disposed under the cover layer; and a capacitor disposed on the circuit board, wherein the cover layer includes a first area overlapping the capacitor and a second area adjacent to the first area when viewed on a plane, wherein an opening is provided in the first area.

20 Claims, 9 Drawing Sheets

1000

WP
OCA1
RPP
OCA2
IS
TFL
DP-OLED
DP-CL
SUB
DP
PF
EB
CSH
GP
CU

DR3

DR1

DR2

ELECTRONIC DEVICE

CROSS-REFERENCE TO RELATED APPLICATION

This application claims priority under 35 U.S.C. § 119 to Korean Patent Application No. 10-2023-0182876 filed on Dec. 15, 2023, in the Korean Intellectual Property Office, the disclosure of which is incorporated by reference herein in its entirety.

TECHNICAL FIELD

Embodiments of the present disclosure described herein relate to an electronic device with improved reliability.

DISCUSSION OF RELATED ART

Multimedia electronic devices, including televisions, mobile phones, tablet computers, navigation systems, game consoles, and similar devices, are equipped with display devices for presenting images. The display device may include an organic light emitting display device. The organic light emitting display device may include a light emitting element that produces light through the recombination of electrons and holes. The organic light emitting electronic device offers benefits such as high response speed and low power consumption.

SUMMARY

Embodiments of the present disclosure provide an electronic device with improved reliability.

According to an embodiment of the present disclosure, there is provided an electronic device including: a display layer; a cover layer disposed under the display layer; a circuit board connected to the display layer and disposed under the cover layer; and a capacitor disposed on the circuit board, wherein the cover layer includes a first area overlapping the capacitor and a second area adjacent to the first area when viewed on a plane, wherein an opening is provided in the first area.

The electronic device further includes: a sensor layer disposed on the display layer and including a plurality of sensing electrodes, and a sensor driver configured to operate the sensor layer, wherein the sensor driver is disposed on the circuit board.

The sensor driver includes a charge pump, wherein the charge pump is electrically connected to the capacitor.

The cover layer includes a metallic material.

Sound is generated by the capacitor, and the sound is diffusely reflected from the opening.

The opening includes a plurality of openings, wherein each of the plurality of openings extends in a first direction and the plurality of openings are spaced apart from each other in a second direction intersecting the first direction when viewed on the plane.

The cover layer includes a sub-cover disposed within the opening.

The sub-cover includes a plurality of sub-covers, wherein the plurality of sub-covers are arranged along a first direction and a second direction intersecting the first direction.

The circuit board is in contact with the cover layer.

The capacitor is spaced apart from the cover layer with the circuit board located therebetween.

The electronic device further includes: a window disposed on the display layer.

The circuit board overlaps the opening when viewed on the plane.

According to an embodiment of the present disclosure, there is provided an electronic device including: a display layer; a sensor layer disposed on the display layer and including a plurality of sensing electrodes; a cover layer disposed under the display layer and having a plurality of openings defined therein; a circuit board connected to the display layer and disposed under the cover layer; a sensor driver configured to operate the sensor layer and disposed on the circuit board; and a capacitor connected to the sensor driver and disposed on the circuit board, wherein the plurality of openings overlap the capacitor when viewed on a plane.

The sensor driver includes a charge pump, wherein the charge pump is electrically connected to the capacitor.

The cover layer includes a metallic material.

Each of the plurality of openings extends in a first direction and the plurality of openings are spaced apart from each other in a second direction intersecting the first direction when viewed on the plane.

The circuit board is in contact with the cover layer.

The capacitor is spaced apart from the cover layer with the circuit board located therebetween.

The electronic device further includes: a window disposed on the display layer.

The circuit board overlaps the opening when viewed on the plane.

BRIEF DESCRIPTION OF THE DRAWINGS

The above and other features of the present disclosure will become apparent by describing in detail embodiments thereof with reference to the accompanying drawings.

DETAILED DESCRIPTION OF THE EMBODIMENTS

Figure 1:
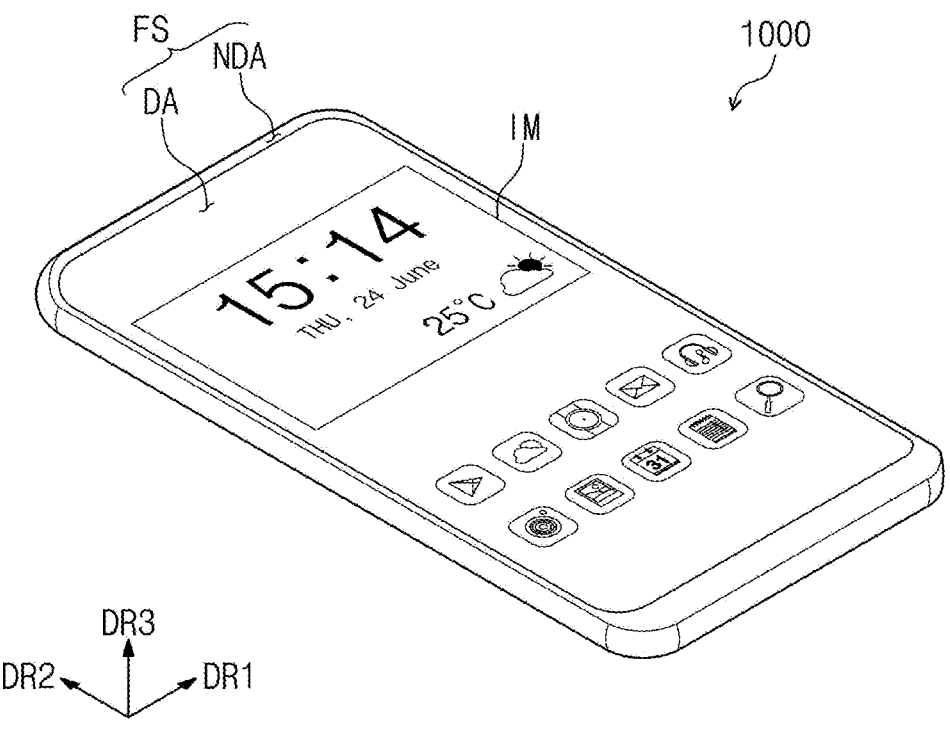
FIG. 1 is a perspective view of an electronic device according to an embodiment of the present disclosure.

As used herein, when a component (or a region, a layer, a portion, and the like) is referred to as being "on", "connected to", or "coupled to" another component, it means that the component may be directly disposed, connected, or coupled on another component, or a third component may be disposed between the two components.

Like reference numerals refer to like components. In addition, in the drawings, thicknesses, ratios, and dimensions of components are exaggerated for effective description of technical content. The term "and/or" includes all possible combinations of the associated components.

Terms such as first, second, and the like may be used to describe various components, but these terms are only for distinguishing one component from another. For example, a first component may be named as a second component, and similarly, the second component may also be named as the first component. The singular expression includes the plural expression unless the context clearly dictates otherwise.

In addition, terms such as "beneath", "below", "on", "above" to describe the relationship of the components as illustrated in the drawings. These terms are relative concepts, and are described with reference to directions indicated in the drawings.

It should be understood that terms such as "include" or "have" specify that a feature, number, step, operation, component, part, or combination thereof described in the specification is present, without excluding the possibility of addition or existence of one or more other features, numbers, steps, operations, components, parts, or combinations thereof.

Unless otherwise defined, all terms including technical and scientific terms used herein have the same meaning as commonly understood by one of ordinary skill in the art to which this disclosure belongs. Additionally, terms defined in commonly used dictionaries should be interpreted consistently with their meaning in the relevant art and not in an overly formal sense unless expressly so defined herein.

Hereinafter, embodiments of the present disclosure will be described with reference to the drawings.

FIG. 1 is a perspective view of an electronic device according to an embodiment of the present disclosure.

Referring to FIG. 1, an electronic device 1000 may be a device that is activated in response to an electrical signal. For example, the electronic device 1000 may be a mobile phone, a foldable mobile phone, a laptop, a television, a tablet, a vehicle navigation system, a game console, or a wearable device, but may not be limited thereto. FIG. 1 shows that the electronic device 1000 is the mobile phone as an example.

In the electronic device 1000, a display surface FS that is parallel to a first direction DR1 and a second direction DR2 intersecting the first direction DR1 may be defined. The display surface FS may include an active area DA and a peripheral area NDA. The electronic device 1000 may display an image IM via the active area DA. The peripheral area NDA may surround the active area DA. The image IM may not be displayed in the peripheral area NDA, but the present disclosure is not limited thereto.

A thickness direction of the electronic device 1000 may be parallel to a third direction DR3 that intersects the first direction DR1 and the second direction DR2. Accordingly, front (or top) surfaces and rear (or bottom) surfaces of members constituting the electronic device 1000 may be defined based on the third direction DR3.

Figure 2:
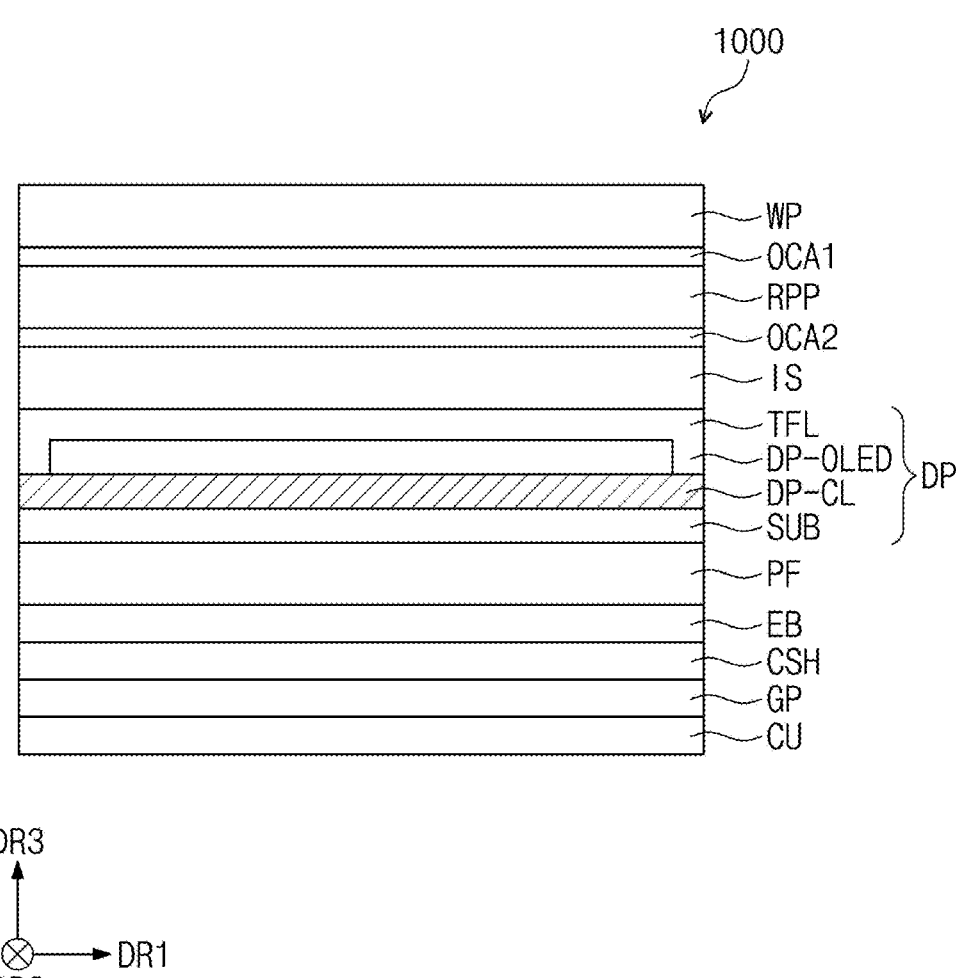
FIG. 2 is a schematic cross-sectional view of an electronic device according to an embodiment of the present disclosure.

FIG. 2 is a schematic cross-sectional view of an electronic device according to an embodiment of the present disclosure.

Referring to FIG. 2, the electronic device 1000 may include a window WP, adhesive layers OCA1 and OCA2, an anti-reflection layer RPP, a sensor layer IS, a display layer DP, a protective layer PF, an embossed layer EB, a cushion layer CSH, a heat dissipating sheet GP, and a cover layer CU.

The window WP may form a part of the outer appearance of the electronic device 1000. The window WP may protect the internal components of the electronic device 1000 from external impacts and substantially provide the active area DA of the electronic device 1000. For example, the window WP may include a glass substrate, a sapphire substrate, or a plastic film. The window WP may have a multi-layer or single-layer structure. For example, the window WP may have a stacked structure of a plurality of plastic films bonded together with an adhesive or a glass substrate and a plastic film bonded to each other with the adhesive.

The adhesive layer OCA1 may be disposed beneath the window WP. The window WP and the anti-reflection layer RPP may be bonded to each other by the adhesive layer OCA1. The adhesive layer OCA1 may contain an adhesive or gluing agent. For example, the adhesive layer OCA1 may be an optically clear adhesive film, an optically clear adhesive resin, or a pressure sensitive adhesive film.

The anti-reflection layer RPP may be disposed under the window WP. The anti-reflection layer RPP may reduce the reflectance of natural light (or sunlight) incident from above the window WP.

The anti-reflection layer RPP according to one embodiment of the present disclosure may include a phase retarder and a polarizer. The phase retarder may be of a film type or a liquid crystal coating type. The phase retarder may include a $\lambda/2$ phase retarder and/or a $\lambda/4$ phase retarder. The polarizer may be of the film type or the liquid crystal coating type. The film type may include a stretched synthetic resin film, while the liquid crystal coating type may include liquid crystals arranged in a specific pattern. The phase retarder and the polarizer may further include a protective film. The phase retarder, the polarizer, or the protective film may be defined as a base layer of the anti-reflection layer RPP.

The adhesive layer OCA2 may be disposed beneath the anti-reflection layer RPP. The anti-reflection layer RPP and the sensor layer IS may be bonded to each other by the adhesive layer OCA2. The adhesive layer OCA2 may contain substantially the same material as the adhesive layer OCA1.

The sensor layer IS may obtain coordinate information from an external input. The sensor layer IS according to one embodiment of the present disclosure may be disposed directly on a surface of the display layer DP. For example, the sensor layer IS may be integrated with the display layer DP in an on-cell manner. The sensor layer IS may be manufactured through a continuous process along with the display layer DP. However, the present disclosure may not be limited thereto, and the sensor layer IS may be manufactured via a separate process and then attached to the display layer DP. The sensor layer IS may include a touch panel.

The display layer DP may be disposed beneath the sensor layer IS. The display layer DP may be a component that actually creates the image. The display layer DP may be a light emitting display layer and may not be particularly limited thereto. For example, the display layer DP may include an organic light emitting display layer, a quantum dot display layer, a micro light emitting diode (LED) display layer, or a nano LED display layer. The display layer DP may include a base layer SUB, a display circuit layer DP-CL, an image implementing layer DP-OLED, and a thin film encapsulation layer TFL.

The protective layer PF may be disposed beneath the display layer DP. The protective layer PF may protect a bottom surface of the display layer DP. The protective layer PF may contain polyethylene terephthalate (PET). However, the material of the protective layer PF is not particularly limited thereto.

The embossed layer EB may be disposed beneath the protective layer PF. The embossed layer EB may be colored. For example, the embossed layer EB may be black. The embossed layer EB may absorb the light incident thereon. The embossed layer EB may be a layer that has adhesive properties on both of its surfaces. The embossed layer EB may contain an adhesive or gluing agent. The protective layer PF and the cushion layer CSH may be bonded to each other by the embossed layer EB.

The cushion layer CSH may be disposed beneath the embossed layer EB. The cushion layer CSH may function to relieve pressure applied from the outside. The cushion layer CSH may contain a sponge, a foam, a urethane resin, and the like. A thickness of the cushion layer CSH may be greater than a thickness of the embossed layer EB.

The heat dissipating sheet GP may be disposed beneath the cushion layer CSH. The heat dissipating sheet GP can facilitate the dissipation of heat generated in the display layer DP. For example, the heat dissipating sheet GP may be a graphite sheet. In one embodiment of the present disclosure, a film layer may be further disposed between the cushion layer CSH and the heat dissipating sheet GP. The film layer may contain polyimide (PI).

The cover layer CU may be disposed under the protective layer PF. The cover layer CU may be conductive. The cover layer CU may contain a metallic material. For example, the cover layer CU may contain copper (Cu). For example, the cover layer CU may be a copper tape (Cu tape). However, the present disclosure is not particularly limited thereto. A ground voltage may be applied to the cover layer CU. However, this is merely an example, and the cover layer CU may be floated.

Figure 3:
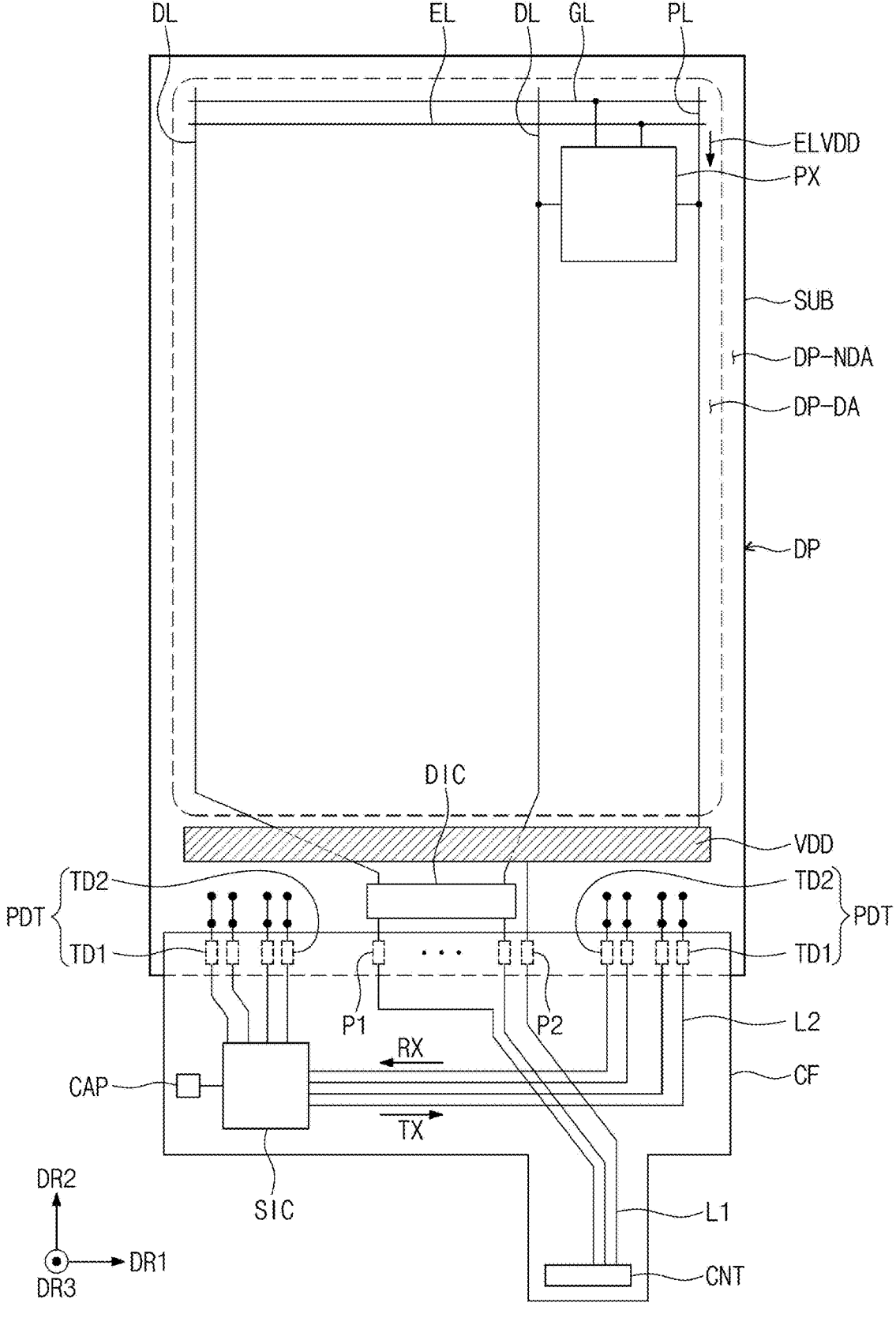
FIG. 3 is a plan view showing a display layer and a circuit board according to an embodiment of the present disclosure.

FIG. 3 is a plan view showing a display layer and a circuit board according to an embodiment of the present disclosure.

Referring to FIGS. 2 and 3, the electronic device 1000 (see FIG. 2) may further include a power pattern VDD, a data driver DIC, a circuit board CF, a sensor driver SIC, a capacitor CAP, and a connector CNT.

In the display layer DP, a display area DP-DA and a peripheral area DP-NDA adjacent to the display area DP-DA may be defined. The display area DP-DA may be an area where the image is displayed. A plurality of pixels PX may be disposed in the display area DP-DA. The peripheral area DP-NDA may be an area where a driving circuit, a driving wire, and the like are disposed.

The display layer DP may include the base layer SUB, the plurality of pixels PX, a plurality of signal wires GL, DL, PL, and EL, a plurality of display pads P1 and P2, and a plurality of sensing pads PDT.

Each of the plurality of pixels PX may render one of primary colors or one of mixed colors. The primary colors may include red, green, or blue. The mixed colors may include various colors such as white, yellow, cyan, or magenta. However, the color rendered by each pixel PX is not limited thereto.

The plurality of signal wires GL, DL, PL, and EL may be disposed on the base layer SUB. The plurality of signal wires GL, DL, PL, and EL may be connected to the plurality of pixels PX and transmit electrical signals to the plurality of pixels PX. The plurality of signal wires GL, DL, PL, and EL may include the plurality of scan wires GL, the plurality of data wires DL, the plurality of power lines PL, and the plurality of light emission control wires EL. However, this is merely an example, and a configuration of the plurality of signal wires GL, DL, PL, and EL according to one embodiment of the present disclosure is not limited thereto. For example, the plurality of signal wires GL, DL, PL, and EL according to one embodiment of the present disclosure may further include an initialization voltage wire.

The power pattern VDD may be disposed in the peripheral area DP-NDA. The power pattern VDD may be connected to the plurality of power lines PL. Each of the plurality of pixels PX may receive a power voltage ELVDD provided by the power line PL.

The plurality of display pads P1 and P2 may be disposed in the peripheral area DP-NDA. The plurality of display pads P1 and P2 may include the first pad P1 and the second pad P2. The first pad P1 may include a plurality of first pads. The plurality of first pads P1 may be respectively connected to the plurality of data wires DL. The second pad P2 may be connected to the power pattern VDD and electrically connected to the plurality of power lines PL. The display layer DP may provide the electrical signals provided from the outside to the plurality of pixels PX via the plurality of display pads P1 and P2. In one example, the plurality of display pads P1 and P2 may further include pads for receiving other electrical signals in addition to the first pad P1 and the second pad P2, and are not limited to any one embodiment.

The data driver DIC may be mounted in the peripheral area DP-NDA. The data driver DIC may be a timing control circuit in a chip form. The data driver DIC may output a grayscale voltage to the plurality of data wires DL in response to frame data of image data. The plurality of data wires DL may be respectively electrically connected to the plurality of first pads P1 via the data driver DIC. However, this is merely an example, and the data driver DIC according to one embodiment of the present disclosure may be mounted on a film separate from the display layer DP. The data driver DIC may be electrically connected to the plurality of display pads P1 and P2 via the film.

The plurality of sensing pads PDT may be disposed in the peripheral area DP-NDA. The plurality of sensing pads PDT may be electrically connected to a plurality of sensing electrodes of the sensor layer IS, respectively. The plurality of sensing pads PDT may include a plurality of first sensing pads TD1 and a plurality of second sensing pads TD2.

The circuit board CF may be electrically connected to the plurality of display pads P1 and P2 and the plurality of sensing pads PDT.

The sensor driver SIC may be mounted on the circuit board CF. The sensor driver SIC may be electrically connected to the plurality of sensing pads PDT. The sensor driver SIC may operate the sensor layer IS.

The capacitor CAP may be mounted on the circuit board CF. The capacitor CAP may be electrically connected to the sensor driver SIC.

A first wire L1 may be electrically connected to the data driver DIC. For example, the first wire L1 may be connected to and located between the plurality of display pads P1 and P2 and the connector CNT. The first wire L1 may transmit and receive a data signal DATA. The data signal DATA may be referred to as a MIPI signal. The first wire L1 may be disposed on the circuit board CF. The first wire L1 may be referred to as a MIPI wire.

A second wire L2 may be electrically connected to and located between the sensor layer IS and the sensor driver SIC. For example, the second wire L2 may be connected to and located between the plurality of sensing pads PDT and the sensor driver SIC. The second wire L2 may be provided with a touch transmission signal TX and a touch reception signal RX. The second wire L2 may be disposed on the circuit board CF.

The connector CNT may be electrically connected to each of the first wire L1 and the second wire L2. The connector CNT may be disposed on the circuit board CF. The connector CNT may be connected to a host processor.

The host processor may include at least one of a central processing unit (CPU) and an application processor. The host processor may further include at least one of a graphics processing unit (GPU), a communication processor (CP), and an image signal processor (ISP). The host processor may further include a neural processing unit (NPU). The neural processing unit is a processor specialized in handling artificial intelligence models, which can be created through machine learning. The artificial intelligence model may include a plurality of artificial neural network layers. The artificial neural network may be one of a deep neural network (DNN), a convolutional neural network (CNN), a recurrent neural network (RNN), a restricted Boltzmann machine (RBM), a deep belief network (DBN), a bidirectional recurrent deep neural network (BRDNN), a deep Q-network, or a combination of two or more of the above, but may not be limited to the examples described above. In addition to a hardware structure, the artificial intelligence model may additionally or alternatively include a software structure. At least two of the above-described processing units and processors may be implemented as a single integrated component (e.g., a single chip) or each may be implemented as an independent component (e.g., a plurality of chips).

The circuit board CF may be bent to a rear surface of the display layer DP. In other words, the bottom surface of the display layer DP and a bottom surface of the circuit board CF may be arranged to face each other.

Figure 4:
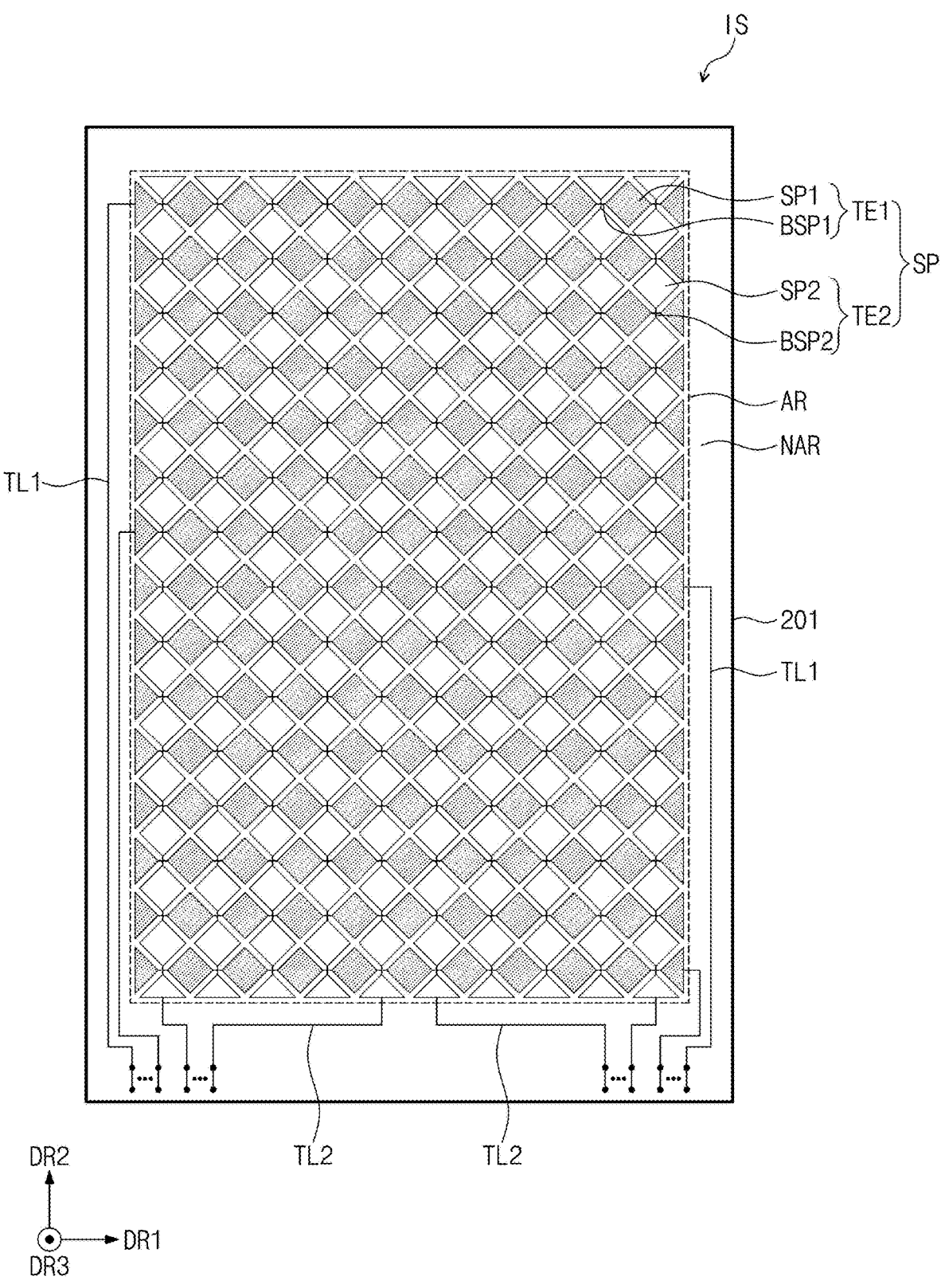
FIG. 4 is a top view of a sensor layer according to an embodiment of the present disclosure.

FIG. 4 is a top view of a sensor layer according to an embodiment of the present disclosure.

Referring to FIGS. 3 and 4, the sensor layer IS may include an active area AR and a peripheral area NAR adjacent to the active area AR. The active area AR may be an area that is activated in response to the electrical signal. The active area AR may be an area that senses the input. The active area AR may overlap the display area DP-DA of the display layer DP. The peripheral area NAR may overlap the peripheral area DP-NDA of the display layer DP.

The sensor layer IS may include a plurality of sensing electrodes SP and a plurality of sensing lines TL1 and TL2. A plurality of first sensing electrodes TE1 and a plurality of second sensing electrodes TE2 may be disposed in the active area AR, and the plurality of sensing lines TL1 and TL2 may be disposed in the peripheral area NAR.

A base layer 201 may be an inorganic layer containing one of silicon nitride, silicon oxynitride, and silicon oxide. Alternatively, the base layer 201 may be an organic layer containing an epoxy resin, an acrylic resin, or an imide-based resin. The base layer 201 may be formed directly on the display layer DP. Alternatively, the base layer 201 may be bonded to the display layer DP via an adhesive member.

The plurality of sensing electrodes SP may include the plurality of first sensing electrodes TE1 and the plurality of second sensing electrodes TE2. The sensor layer IS may obtain information about the external input through a change in capacitance between the plurality of first sensing electrodes TE1 and the plurality of second sensing electrodes TE2.

Each of the plurality of first sensing electrodes TE1 may extend along the first direction DR1, and the plurality of first sensing electrodes TE1 may be arranged along the second direction DR2. Each of the plurality of first sensing electrodes TE1 may include a plurality of first portions SP1 and a plurality of second portions BSP1. Each of the plurality of second portions BSP1 may electrically connect the two adjacent first portions SP1 to each other. The plurality of first portions SP1 and the plurality of second portions BSP1 may have a mesh structure. The plurality of first portions SP1 may be referred to as the plurality of first sensing portions SP1. The plurality of second portions BSP1 may be referred to as the plurality of first connecting portions BSP1.

Each of the plurality of second sensing electrodes TE2 may extend along the second direction DR2, and the plurality of second sensing electrodes TE2 may be arranged along the first direction DR1. Each of the plurality of second sensing electrodes TE2 may include a plurality of sensing patterns SP2 and a plurality of bridge patterns BSP2. Each of the plurality of bridge patterns BSP2 may electrically connect the two adjacent sensing patterns SP2 to each other. The plurality of sensing patterns SP2 may have a mesh structure. The plurality of sensing patterns SP2 may be referred to as the plurality of second sensing portions SP2. The plurality of bridge patterns BSP2 may be referred to as the plurality of second connecting portions BSP2.

The plurality of second portions BSP1 may be disposed on a different layer from the plurality of bridge patterns BSP2. The plurality of bridge patterns BSP2 may intersect the plurality of first sensing electrodes TE1 in an insulated manner. For example, the plurality of second portions BSP1 may intersect the plurality of bridge patterns BSP2 in the insulated manner.

The plurality of sensing lines TL1 and TL2 may include the plurality of first sensing lines TL1 and the plurality of second sensing lines TL2. The plurality of first sensing lines TL1 may be electrically connected to the plurality of first sensing electrodes TE1, respectively. The plurality of second sensing lines TL2 may be electrically connected to the plurality of second sensing electrodes TE2, respectively.

The plurality of first sensing lines TL1 may be electrically connected to the plurality of first sensing pads TD1 via contact holes, respectively. The plurality of second sensing lines TL2 may be electrically connected to the plurality of second sensing pads TD2 via contact holes, respectively.

Figure 5:
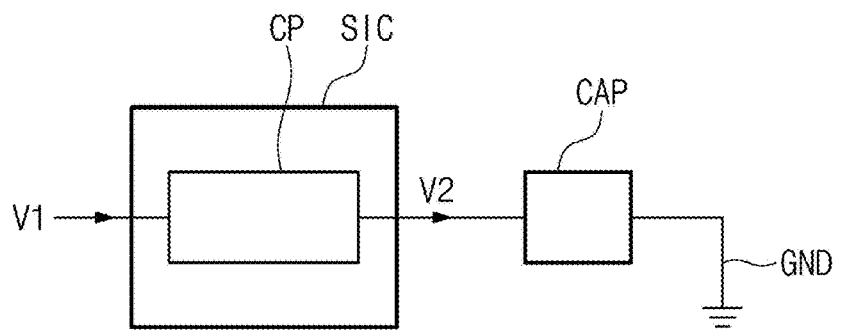
FIG. 5 is a block diagram showing a sensor driver and a capacitor according to an embodiment of the present disclosure.

FIG. 5 is a block diagram showing a sensor driver and a capacitor according to an embodiment of the present disclosure.

Referring to FIGS. 3 and 5, the sensor driver SIC may include a charge pump CP. The charge pump CP may be electrically connected to the capacitor CAP.

The charge pump CP may boost or reduce a received voltage. The charge pump CP may convert a first voltage V1 received from a power circuit into a second voltage V2 that may be used by the sensor driver SIC.

The power circuit may include a power management integrated circuit (PMIC). The power circuit may generate a plurality of driving voltages to operate the display layer DP, the sensor layer IS, the data driver DIC, and the sensor driver SIC. For example, the plurality of driving voltages may include a gate high voltage, a gate low voltage, a first driving voltage (e.g., an ELVSS voltage), a second driving voltage (e.g., an ELVDD voltage), the first voltage V1 (e.g., a bias voltage), and an initialization voltage, but may not be particularly limited to the above examples.

The first voltage V1 may be a DC voltage. The first voltage V1 may have a voltage level of approximately 3V (volt).

The second voltage V2 may swing to predetermined voltage levels. In other words, the second voltage V2 can fluctuate between predetermined voltage levels. The second voltage V2 may swing between a first voltage level and a second voltage level having a higher voltage level than the first voltage level. For example, the first voltage level may be 3.3V and the second voltage level may be 6V.

The capacitor CAP may be connected to and located between the charge pump CP and a ground electrode GND. The capacitor CAP may eliminate noise generated by the charge pump CP. The capacitor CAP may be referred to as a stabilizing capacitor.

The capacitor CAP may be repeatedly charged and discharged by the second voltage V2 generated by the charge pump CP. The capacitor CAP may vibrate as it is charged or discharged to the first voltage level and/or the second voltage level. This vibrations of the capacitor CAP can generate audible noise.

Figure 6:
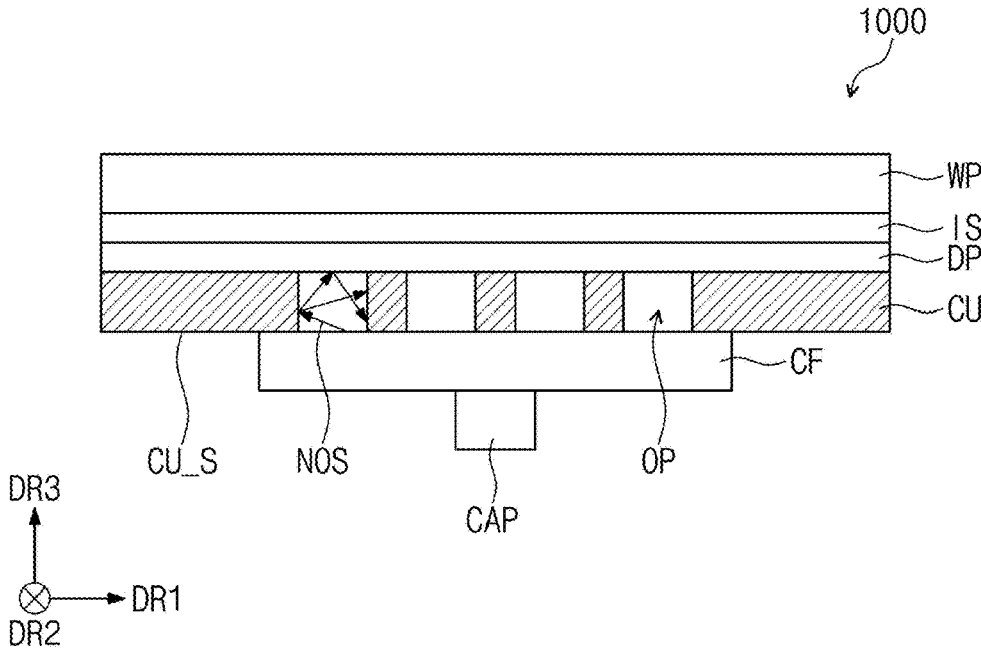
FIG. 6 is a cross-sectional view of an electronic device according to an embodiment of the present disclosure.

FIG. 6 is a cross-sectional view of an electronic device according to an embodiment of the present disclosure. In describing FIG. 6, the components described in FIGS. 2 and 5 are given the same reference numerals and descriptions thereof are omitted.

Referring to FIG. 6, the cover layer CU may be disposed beneath the display layer DP. The cover layer CU may be in direct contact with the display layer DP. The circuit board CF may be electrically connected to the display layer DP. The circuit board CF may be bent from the display layer DP and disposed beneath the cover layer CU. The circuit board CF may be in contact with a rear surface CU_S of the cover layer CU.

The capacitor CAP may be mounted on the circuit board CF. As the circuit board CF is bent, FIG. 6 shows that the capacitor CAP is disposed beneath the circuit board CF. FIG. 6 further shows that the capacitor CAP is disposed beneath the display layer DP.

A plurality of openings OP may be defined in the cover layer CU. When viewed on a plane, the plurality of openings OP may overlap the capacitor CAP. However, the capacitor CAP may also overlap a portion of the cover layer CU. The plurality of openings OP may overlap the circuit board CF. The plurality of openings OP may be spaced apart from each other in the first direction DR1. An empty space may be defined in the cover layer CU by the plurality of openings OP.

According to the present disclosure, audible noise NOS generated in the capacitor CAP may be diffusely reflected by the plurality of openings OP. The diffusely reflected audible noise NOS may be decomposed and reduced or eliminated. In other words, the transmission of audible noise NOS to the window WP may be prevented or eliminated. Consequently, a user may not perceive the audible noise NOS even if their ear is in contact with the window WP while talking on the phone. Accordingly, the electronic device 1000 with improved reliability may be provided.

Additionally, according to the present disclosure, the cover layer CU may contain metallic material. The audible noise NOS transmitted into the plurality of openings OP may be easily reflected. In other words, the audible noise NOS may be diffusely reflected from the plurality of openings OP. This allows the audible noise NOS to be easily decomposed. The transmission of audible noise NOS to the window WP may be reduced or eliminated. Accordingly, the electronic device 1000 with the improved reliability may be provided.

Figure 7:
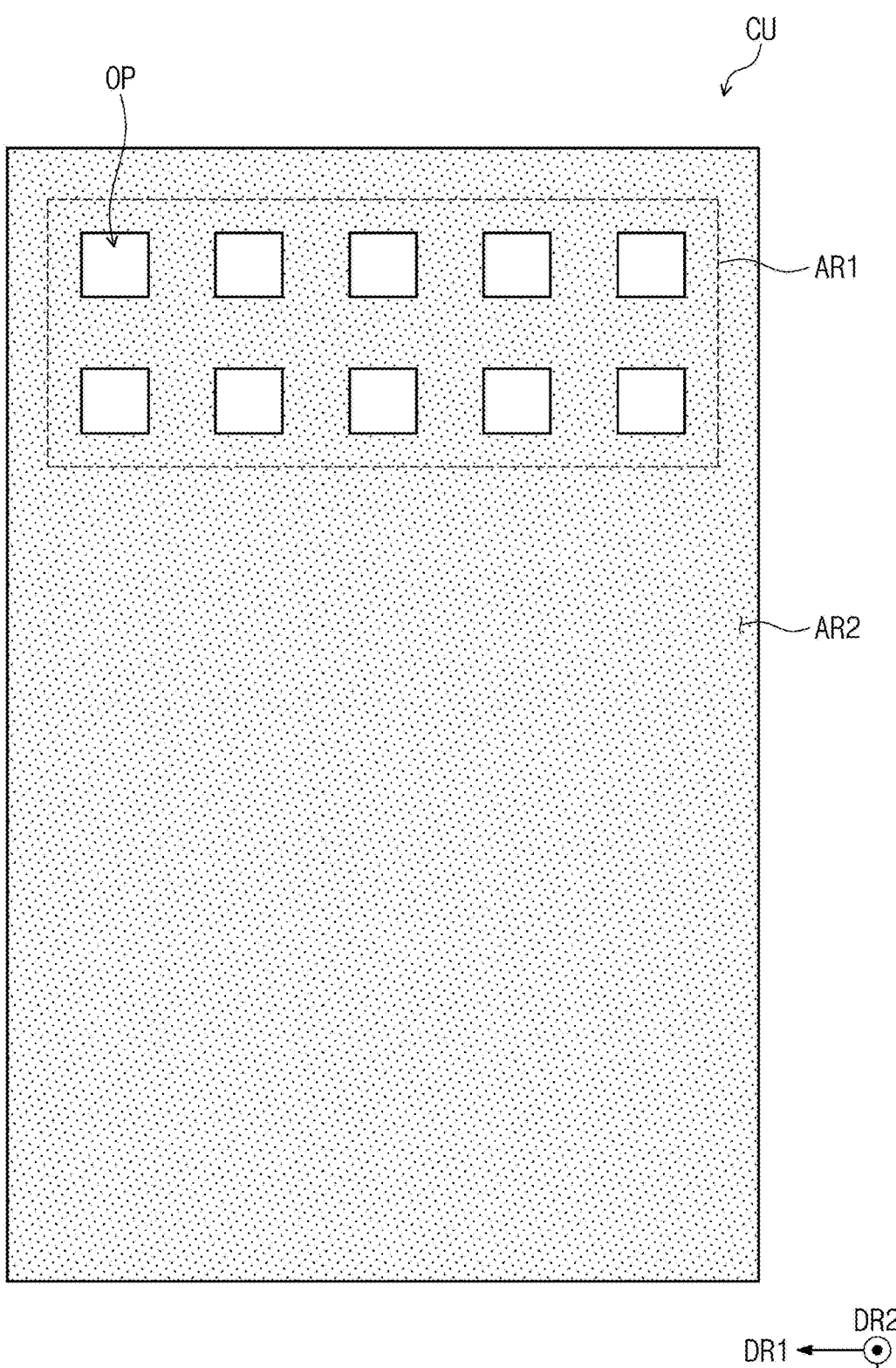
FIG. 7 is a plan view of a cover layer according to an embodiment of the present disclosure.

FIG. 7 is a plan view of a cover layer according to an embodiment of the present disclosure.

Referring to FIGS. 6 and 7, a first area AR1 and a second area AR2 adjacent to the first area AR1 may be defined in the cover layer CU.

The first area AR1 may be an area that overlaps with the capacitor CAP on a plane. The size of the first area AR1 may be defined based on the dimensions of the capacitor CAP. The plurality of openings OP may be defined in the first area AR1.

When viewed on a plane, the plurality of openings OP may overlap the capacitor CAP.

The second area AR2 may surround the first area AR1. The first area AR1 and the second area AR2 may be provided integrally. The second area AR2 may be formed as a single plate without any separate openings.

When viewed on a plane, the plurality of openings OP may be arranged along the first direction DR1 and the second direction DR2.

According to the present disclosure, the audible noise NOS generated in the capacitor CAP may be diffusely reflected by the plurality of openings OP. This diffusely reflected audible noise NOS may be decomposed and subsequently reduced or eliminated. In other words, the transmission of the audible noise NOS to the window WP may be prevented or eliminated. As a result, the user may not perceive the audible noise NOS even when their ear is in contact with the window WP while talking on the phone. Accordingly, the electronic device 1000 with the improved reliability may be provided.

Figure 8A:
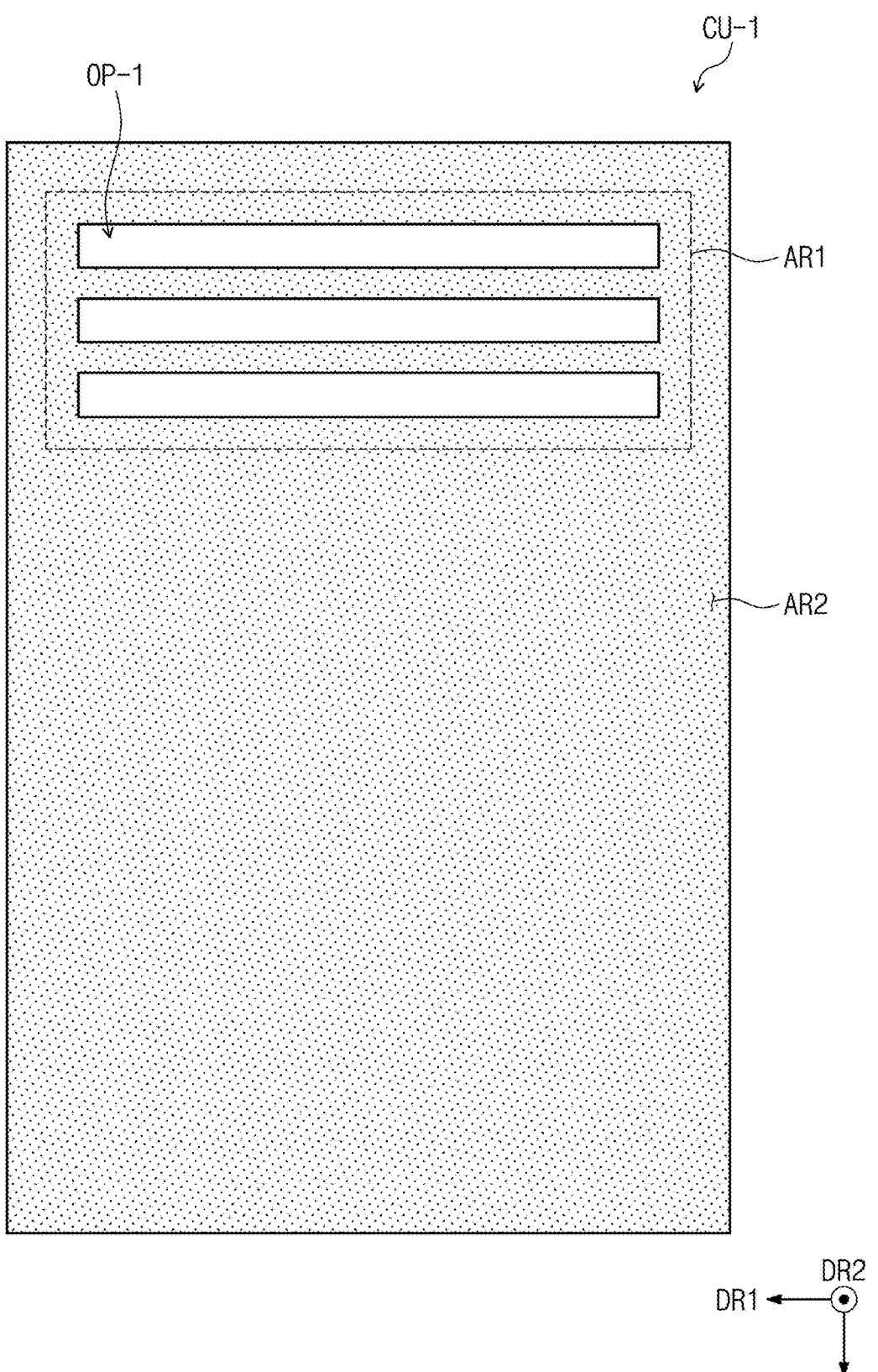
FIG. 8A is a plan view of a cover layer according to an embodiment of the present disclosure.

FIG. 8A is a plan view of a cover layer according to an embodiment of the present disclosure. In describing FIG. 8A, the components described in FIG. 7 are given the same reference numerals and descriptions thereof are omitted.

Referring to FIGS. 6 and 8A, a plurality of openings OP-1 may be defined in a cover layer CU-1. The plurality of openings OP-1 may be defined in the first area AR1 of the cover layer CU-1.

When viewed on a plane, the plurality of openings OP-1 may overlap the capacitor CAP.

When viewed on a plane, each of the plurality of openings OP-1 may extend in the first direction DR1. The plurality of openings OP-1 may be spaced apart from each other in the second direction DR2.

According to the present disclosure, the audible noise NOS generated in the capacitor CAP may be diffusely reflected by the plurality of openings OP-1. This diffusely reflected audible noise NOS may be decomposed and subsequently reduced or eliminated. In other words, the transmission of the audible noise NOS to the window WP may be reduced or eliminated. As a result, the user may not perceive the audible noise NOS even when their ear is in contact with the window WP while talking on the phone. Accordingly, the electronic device 1000 with the improved reliability may be provided.

Figure 8B:
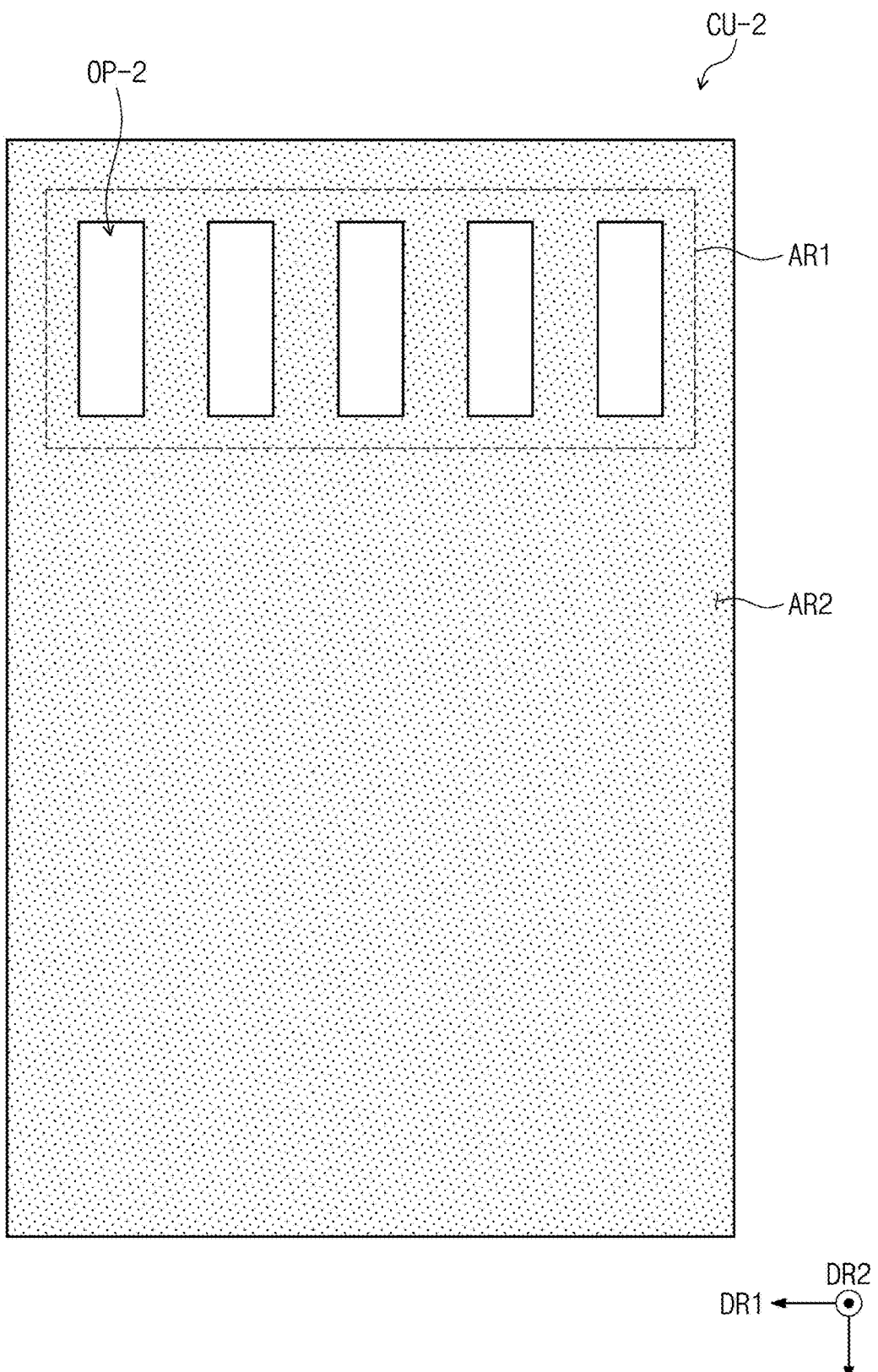
FIG. 8B is a plan view of a cover layer according to an embodiment of the present disclosure.

FIG. 8B is a plan view of a cover layer according to an embodiment of the present disclosure. In describing FIG. 8B, the components described in FIG. 7 are given the same reference numerals and descriptions thereof are omitted.

Referring to FIGS. 6 and 8B, a plurality of openings OP-2 may be defined in a cover layer CU-2. The plurality of openings OP-2 may be defined in the first area AR1 of the cover layer CU-2.

When viewed on a plane, the plurality of openings OP-2 may overlap the capacitor CAP.

When viewed on a plane, each of the plurality of openings OP-2 may extend in the second direction DR2. The plurality of openings OP-2 may be spaced apart from each other in the first direction DR1.

According to the present disclosure, the audible noise NOS generated in the capacitor CAP may be diffusely reflected by the plurality of openings OP-2. This diffusely reflected audible noise NOS may be decomposed and subsequently reduced or eliminated. In other words, the transmission of the audible noise NOS to the window WP may be reduced or eliminated. As a result, the user may not perceive the audible noise NOS even when their ear is in contact with the window WP while talking on the phone. Accordingly, the electronic device 1000 with the improved reliability may be provided.

Figure 8C:
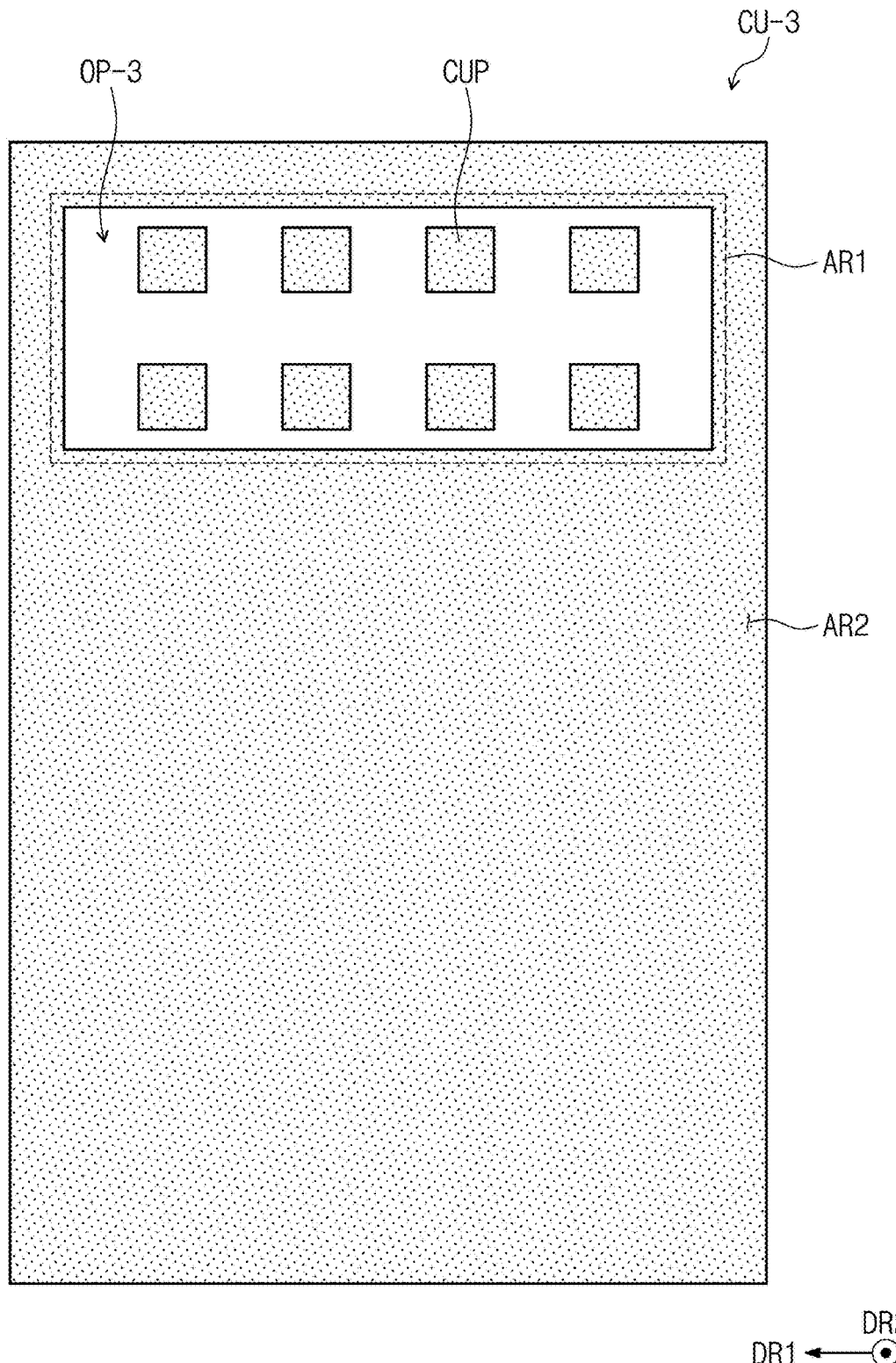
FIG. 8C is a plan view of a cover layer according to an embodiment of the present disclosure.

FIG. 8C is a plan view of a cover layer according to an embodiment of the present disclosure. In describing FIG. 8C, the components described in FIG. 7 are given the same reference numerals and descriptions thereof are omitted.

Referring to FIGS. 6 and 8C, an opening OP-3 may be defined in a cover layer CU-3. The opening OP-3 may be defined in the first area AR1 of the cover layer CU-3.

When viewed on a plane, the opening OP-3 may overlap the capacitor CAP.

When viewed on a plane, the cover layer CU-3 may include a plurality of sub-covers CUP disposed within the opening OP-3. The plurality of sub-covers CUP may be arranged in the first area AR1. The plurality of sub-covers CUP may be arranged in the first direction DR1 and the second direction DR2.

According to the present disclosure, the audible noise NOS generated in the capacitor CAP may be diffusely reflected by the opening OP-3. This diffusely reflected audible noise NOS may be decomposed and subsequently reduced or eliminated. In other words, the transmission of the audible noise NOS to the window WP may be reduced or eliminated. As a result, the user may not perceive the audible noise NOS even when their ear is in contact with the window WP while talking on the phone. Accordingly, the electronic device 1000 with the improved reliability may be provided.

As described above, the audible noise generated by the capacitor may be diffusely reflected by the plurality of openings. The diffusely reflected audible noise may be decomposed and reduced or eliminated. In other words, the transmission of the audible noise to the window may be prevented or eliminated. As a result, the user may not perceive the audible noise even when their ear is in contact with the window while talking on the phone. Therefore, the electronic device with the improved reliability may be provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An electronic device comprising:
a display layer;
a cover layer disposed under the display layer;
a circuit board connected to the display layer and disposed under the cover layer; and
a capacitor disposed on the circuit board,
wherein the cover layer includes a first area overlapping the capacitor and a second area adjacent to the first area when viewed on a plane,
wherein an opening is provided in the first area, an entirety of the opening overlapping the circuit board on the plane.

2. The electronic device of claim 1, further comprising:
a sensor layer disposed on the display layer and including a plurality of sensing electrodes, and a sensor driver configured to operate the sensor layer,
wherein the sensor driver is disposed on the circuit board.

3. The electronic device of claim 2, wherein the sensor driver includes a charge pump,
wherein the charge pump is electrically connected to the capacitor.

4. The electronic device of claim 1, wherein the cover layer includes a metallic material.

5. The electronic device of claim 1, wherein sound is generated by the capacitor, and the sound is diffusely reflected from the opening.

6. The electronic device of claim 1, wherein the opening includes a plurality of openings,
wherein each of the plurality of openings extends in a first direction and the plurality of openings are spaced apart from each other in a second direction intersecting the first direction when viewed on the plane.

7. The electronic device of claim 1, wherein the cover layer includes a sub-cover disposed within the opening.

8. The electronic device of claim 7, wherein the sub-cover includes a plurality of sub-covers,
wherein the plurality of sub-covers are arranged along a first direction and a second direction intersecting the first direction.

9. The electronic device of claim 1, wherein the circuit board is in contact with the cover layer.

10. The electronic device of claim 1, wherein the capacitor is spaced apart from the cover layer with the circuit board located therebetween.

11. The electronic device of claim 1, further comprising: a window disposed on the display layer.

12. The electronic device of claim 1, wherein the circuit board overlaps the opening when viewed on the plane.

13. An electronic device comprising:
a display layer;
a sensor layer disposed on the display layer and including a plurality of sensing electrodes;
a cover layer disposed under the display layer and having a plurality of openings defined therein;
a circuit board connected to the display layer and disposed under the cover layer;
a sensor driver configured to operate the sensor layer and disposed on the circuit board; and
a capacitor connected to the sensor driver and disposed on the circuit board,
wherein the plurality of openings overlap the capacitor when viewed on a plane.

14. The electronic device of claim 13, wherein the sensor driver includes a charge pump,
wherein the charge pump is electrically connected to the capacitor.

15. The electronic device of claim 13, wherein the cover layer includes a metallic material.

16. The electronic device of claim 13, wherein each of the plurality of openings extends in a first direction and the plurality of openings are spaced apart from each other in a second direction intersecting the first direction when viewed on the plane.

17. The electronic device of claim 13, wherein the circuit board is in contact with the cover layer.

18. The electronic device of claim 13, wherein the capacitor is spaced apart from the cover layer with the circuit board located therebetween.

19. The electronic device of claim 13, further comprising:
a window disposed on the display layer.

20. The electronic device of claim 13, wherein the circuit board overlaps the opening when viewed on the plane.

* * * * *